(12) United States Patent
Zhang

(10) Patent No.: US 11,366,388 B2
(45) Date of Patent: *Jun. 21, 2022

(54) COLOR PHOTORESIST COMPOSITION

(71) Applicant: TCL China Star Optoelectronics Technology Co., Ltd., Guangdong (CN)

(72) Inventor: Yuehong Zhang, Guangdong (CN)

(73) Assignee: TCL CHINA STAR OPTOELECTRONICS TECHNOLOGY CO., LTD., Guangdong (CN)

(*) Notice: Subject to any disclaimer, the term of this patent is extended or adjusted under 35 U.S.C. 154(b) by 45 days.

This patent is subject to a terminal disclaimer.

(21) Appl. No.: 16/616,479

(22) PCT Filed: Aug. 22, 2019

(86) PCT No.: PCT/CN2019/102041
§ 371 (c)(1),
(2) Date: Nov. 24, 2019

(87) PCT Pub. No.: WO2020/228169
PCT Pub. Date: Nov. 19, 2020

(65) Prior Publication Data
US 2020/0409267 A1 Dec. 31, 2020

(30) Foreign Application Priority Data
May 14, 2019 (CN) .......................... 201910397555.7

(51) Int. Cl.
*G03F 7/09* (2006.01)
*G02B 5/22* (2006.01)
*C09B 47/04* (2006.01)
*C09B 47/08* (2006.01)
*G03F 7/031* (2006.01)

(52) U.S. Cl.
CPC ............ *G03F 7/091* (2013.01); *C09B 47/045* (2013.01); *C09B 47/085* (2013.01); *G02B 5/223* (2013.01); *G03F 7/031* (2013.01)

(58) Field of Classification Search
CPC ..... C09B 47/045; C09B 47/08; C09B 47/085; G02B 5/223; C08K 5/3417; G03F 7/031; G03F 7/091
See application file for complete search history.

(56) References Cited

U.S. PATENT DOCUMENTS

| 5,110,916 A * | 5/1992 | Yamamoto | C07D 487/22 534/15 |
| 5,270,854 A | 12/1993 | Lee et al. | |
| 9,291,894 B2 * | 3/2016 | Liu | G02F 1/133514 |
| 2015/0108086 A1 | 4/2015 | Samejima et al. | |
| 2015/0203608 A1 * | 7/2015 | Wang | C08F 8/12 252/586 |
| 2020/0399475 A1 * | 12/2020 | Zhang | C09B 47/08 |

FOREIGN PATENT DOCUMENTS

| CN | 101441413 A | 5/2009 |
| CN | 104334594 A | 2/2015 |
| CN | 105732646 A | 7/2016 |

OTHER PUBLICATIONS

Yuxiang Chen, Fang Ma, Xin Chen, Yuehong Zhang, Hailong Wang, Kang Wang, Dongdong Qi, Hao-Ling Sun, and Jianzhuang Jiang, Bis[1,8,15,22-tetrakis(3-pentyloxy)phthalocyaninato]terbium Double-Decker Single-Ion Magnets, norg. Chem. 2019, 58, 2422-2429. (Year: 2019).*
Elena A. Kuzmina, Tatiana V. Dubinina, Alexander V. Dzuban, Vitaly I. Krasovskii, Olga A. Maloshitskaya, Larisa G. Tomilova, Perchlorinated europium, terbium and lutetium mono (phthalocyaninates): Synthesis, investigation of thermal stability and optical properties, Polyhedron 156 (2018) 14-18. (Year: 2018).*
Lu et al. Infrared spectra of phthalocyanine and naphthalocyanine in sandwich-type (na)phthalocyaninato and porphyrinato rare earth complexes. Part 3. The effects of substituents and molecular symmetry on the infrared characteristics of Spectrochimica Acta Part A 59 (2003) 3273/3286 (Year: 2003).*
Design, Synthesis, Structure and Properties of Phthalocyaninato Complexes.

* cited by examiner

Primary Examiner — Bijan Ahvazi
(74) Attorney, Agent, or Firm — Hamre, Schumann, Mueller & Larson, P.C.

(57) ABSTRACT

The present invention provides a color photoresist composition, including: 5-8 parts by weight of a pigment; 5-8 parts by weight of an alkali soluble resin; 5-8 parts by weight of a phthalocyanine semi-sandwich dye; 0.2-0.6 parts by weight of a photoinitiator; 70-85 parts by weight of a photoresist solvent; and 0.1-0.2 parts by weight of an additive.

9 Claims, No Drawings

COLOR PHOTORESIST COMPOSITION

BACKGROUND OF INVENTION

Field of Invention

The present invention relates to a color photoresist composition, and more particularly to a color photoresist composition that alleviates light scattering in a photoresist.

Description of Prior Art

A color filter (CF) is an important component for color display of a liquid crystal display. A color photoresist is an important composition of color filter and can be divided into three types: red (R), green (G), and blue (B). A current color filter photoresist generally achieves their hue by adding pigments of different colors, wherein the pigments are insoluble materials and introduced into a substrate in a highly dispersed state. Dispersed pigment particles may severely scatter light, which in turn reduces transmittance and contrast of the CF.

In order to improve transmittance and contrast of a color filter, there is an urgent need for a novel color photoresist composition, which can effectively alleviate light scattering in a photoresist, thereby improving transmittance and contrast of the color filter.

SUMMARY OF INVENTION

In view of the above, the present invention provides a color photoresist composition in which a semi-sandwich type phthalocyanine compound is introduced as a dye, which can effectively alleviate light scattering caused by pigment particles in a photoresist due to its high thermal stability and high solubility, thereby improving transmittance and contrast of a color filter.

Accordingly, in accordance with an embodiment of the present invention, the present invention provides a color photoresist composition, including: 5-8 parts by weight of a pigment; 5-8 parts by weight of an alkali soluble resin; 5-8 parts by weight of a phthalocyanine semi-sandwich dye; 0.2-0.6 parts by weight of a photoinitiator; 70-85 parts by weight of a photoresist solvent; and 0.1-0.2 parts by weight of an additive.

In an embodiment of the present invention, the phthalocyanine semi-sandwich type dye includes a semi-sandwich type phthalocyanine compound and a dye solvent, wherein the semi-sandwich type phthalocyanine compound has a structure of Formula 1:

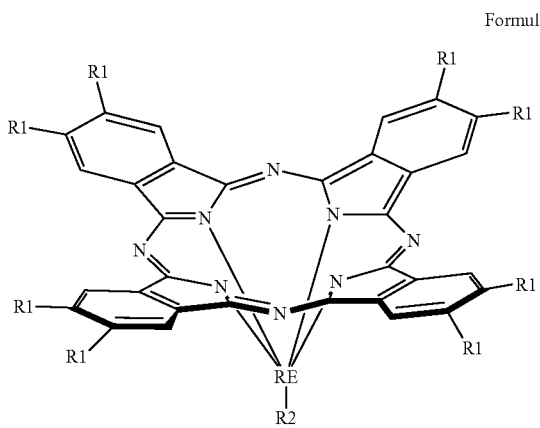

Formula 1 in the Formula 1, a central coordination metal RE is a rare earth metal element;

R1 is selected from at least one of H, an aliphatic carbon chain, an oxycarbon chain, an aromatic ring, a halogen, a carboxyl group, an ester group, an amino group, and a thiol group; and R2 is an organic compound containing an O or N coordinating atom, and the alkali-soluble resin is selected from at least one of an alkyl-substituted acrylic resin, an unsaturated group-substituted acrylic resin, and an epoxy group-substituted acrylic resin.

In an embodiment of the present invention, the rare earth metal element includes: lanthanum (La), cerium (Ce), praseodymium (Pr), cerium (Nd), cerium (Pm), cerium (Sm), europium (Eu), gadolinium (Gd), terbium (Tb), dysprosium (Dy), holmium (Ho), erbium (Er), thulium (Tm), ytterbium (Yb), lutetium (Lu), yttrium (Y), or scandium (Sc).

In an embodiment of the present invention, R1 is selected from at least one of: H, $-C_5H_{12}$, $-C_6H_{14}$, $-OC_4H_{10}$, $-OC_5H_{12}$, $-OC_6H_{14}$, $-OC_8H_{18}$, a benzene ring, a naphthalene ring, F, Cl, Br, I, $-COOH$, $-COOCH_3$, $-NH_2$, $-N(CH_3)_2$, $-SH$, and $-SCH_3$.

In an embodiment of the present invention, R2 is selected from at least one of acetic acid and acetylacetone.

In an embodiment of the present invention, the dye solvent is selected from at least one of $CCl_3$, $CH_3COOCH_3$, dimethylformamide (DMF), and dimethyl sulfoxide (dimethyl sulfoxide, DMSO).

In an embodiment of the present invention, the pigment includes at least one of a green pigment, a blue pigment, and a yellow pigment, wherein the green pigment includes a halogen-substituted copper phthalocyanine pigment; the blue pigment includes a copper phthalocyanine pigment; and the yellow pigment includes an indoline-based pigment, a quinophthalone-based pigment, a nickel composite pigment, or combinations thereof.

In an embodiment of the present invention, the alkali-soluble resin is selected from at least one of an alkyl-substituted acrylic resin, an unsaturated group-substituted acrylic resin, and an epoxy group-substituted acrylic resin. The alkyl-substituted acrylic resin includes: acrylic acid, alkyl methacrylate, aryl methacrylate, methacrylate alcohol ester, or combinations thereof; the unsaturated group-substituted acrylic resin includes succinic acid methacrylate; and the epoxy group-substituted acrylic resin includes epoxy acrylate, epoxy methacrylate, epoxy alkyl methacrylate, epoxy aryl methacrylate, or combinations thereof.

In an embodiment of the present invention, the photoinitiator is selected from at least one of acetophenone, benzoin, diimidazole, and benzophenone, wherein the acetophenone includes α,α-diethoxyacetophenone, 2-hydroxy-2-methyl-1-phenyl-1-propanone (HMPP), 2-methyl-2-morpholine-1-(4-methylphenylthio)propan-1-one, or combinations thereof; the benzoin includes benzoyl, acetophenone, benzoin ether, or combinations thereof; and the diimidazole includes hexaaryl diimidazole.

In an embodiment of the present invention, the photoresist solvent is selected from at least one of an ester solvent, an ether solvent, and a ketone solvent, wherein the ester solvent includes: ethylene glycol ethyl ether acetate, diethylene glycol butyl ether acetate, propylene glycol monomethyl ether ester, or combinations thereof; the ether solvent includes diethylene glycol diethyl ether, ethylene glycol dibutyl ether, or combinations thereof; and the ketone solvent includes cyclohexanone, isophorone, or combinations thereof.

In an embodiment of the present invention, the additive is selected from at least one of a silane coupling agent, an antioxidant, an ultraviolet absorber, an antifoaming agent, and a leveling agent.

The present invention provides a color photoresist composition in which a semi-sandwich type phthalocyanine compound is added as a dye, and the dye has high thermal stability and high solubility, and can effectively alleviate light scattering caused by pigment particles in a photoresist due to its high thermal stability and high solubility, thereby improving transmittance and contrast of a color filter.

BRIEF DESCRIPTION OF DRAWINGS none.

DETAILED DESCRIPTION OF PREFERRED EMBODIMENTS

In order to make the above description of the present invention more comprehensible, the preferred embodiments are described below in detail with reference to the accompanying drawings.

Hereinafter, the present invention will be described in further detail with reference to examples. It is to be understood, however, that these examples are for illustrative purposes only and are not intended to limit the scope of the present invention, and the scope of the present invention should be accorded the broadest interpretation so as to encompass all such modifications and similar arrangements.

The present invention provides a color photoresist composition in which a semi-sandwich type phthalocyanine compound is introduced as a dye, which can effectively alleviate light scattering caused by pigment particles in a photoresist due to its high thermal stability and high solubility, thereby improving transmittance and contrast of a color filter.

Accordingly, in accordance with an embodiment of the present invention, the present invention provides a color resist composition including, based on 100 parts by weight of the color photoresist composition, including: 5-8 parts by weight of a pigment; 5-8 parts by weight of an alkali soluble resin; 5-8 parts by weight of a phthalocyanine semi-sandwich dye; 0.2-0.6 parts by weight of a photoinitiator; 70-85 parts by weight of a photoresist solvent; and 0.1-0.2 parts by weight of an additive.

In an embodiment of the present invention, the phthalocyanine semi-sandwich dye includes a phthalocyanine semi-sandwich compound and a dye solvent, and the phthalocyanine semi-sandwich compound has a structure of Formula 1:

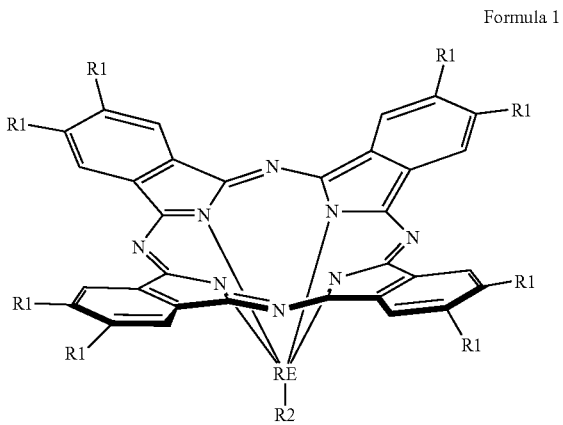

Formula 1 in the Formula 1, a central coordination metal RE is a rare earth metal element;

R1 is selected from at least one of H, an aliphatic carbon chain, an oxycarbon chain, an aromatic ring, a halogen, a carboxyl group, an ester group, an amino group, and a thiol group; and R2 is an organic compound containing an O or N coordinating atom, and the alkali-soluble resin is selected from at least one of an alkyl-substituted acrylic resin, an unsaturated group-substituted acrylic resin, and an epoxy group-substituted acrylic resin.

In an embodiment of the present invention, the rare earth metal element includes: lanthanum (La), cerium (Ce), praseodymium (Pr), cerium (Nd), cerium (Pm), cerium (Sm), europium (Eu), gadolinium (Gd), terbium (Tb), dysprosium (Dy), holmium (Ho), erbium (Er), thulium (Tm), ytterbium (Yb), lutetium (Lu), yttrium (Y), or scandium (Sc).

In an embodiment of the present invention, R1 is selected from at least one of: H, $-C_5H_{12}$, $-C_6H_{14}$, $-OC_4H_{10}$, $-OC_5H_{12}$, $-OC_6H_{14}$, $-OC_8H_{18}$, a benzene ring, a naphthalene ring, F, Cl, Br, I, $-COOH$, $-COOCH_3$, $-NH_2$, $-N(CH_3)_2$, $-SH$, and $-SCH_3$.

In an embodiment of the present invention, R2 may be selected from one of organic compounds containing smaller coordination atoms such as O, N, etc., and for example may be selected from at least one of acetic acid and acetylacetone.

The semi-sandwich type phthalocyanine compound has a structure represented by the Formula 1, wherein since the central coordination metal (RE) has a large radius in the compound and is located outside the phthalocyanine surface, under the coordination action, the phthalocyanine is downwardly bent, and its entire molecule is formed into a bowl-like structure, which significantly reduces t-t interactions between molecules, so that it can have good solubility.

In an embodiment of the present invention, the dye solvent is selected from at least one of $CCl_3$, $CH_3COOCH_3$, dimethylformamide (DMF), and dimethyl sulfoxide (dimethyl sulfoxide, DMSO).

In an embodiment of the present invention, the pigment is not particularly limited, and various pigments known in the art can be used. For example, the pigment may include at least one of a green pigment, a blue pigment, and a yellow pigment, wherein the green pigment includes a halogen-substituted copper phthalocyanine pigment; the blue pigment includes a copper phthalocyanine pigment; and the yellow pigment includes an indoline-based pigment, a quinophthalone-based pigment, a nickel composite pigment, or combinations thereof. The above pigments can be blended in different proportions to achieve the desired color.

In an embodiment of the present invention, the alkali-soluble resin is selected from at least one of an alkyl-substituted acrylic resin, an unsaturated group-substituted acrylic resin, and an epoxy group-substituted acrylic resin. Preferably, the alkyl-substituted acrylic resin includes: acrylic acid, alkyl methacrylate, aryl methacrylate, methacrylate alcohol ester, or combinations thereof; the unsaturated group-substituted acrylic resin includes succinic acid methacrylate; and the epoxy group-substituted acrylic resin includes epoxy acrylate, epoxy methacrylate, epoxy alkyl methacrylate, epoxy aryl methacrylate, or combinations thereof.

In an embodiment of the present invention, the photoinitiator is selected from at least one of acetophenone, benzoin, diimidazole, and benzophenone. Preferably, the acetophenone includes α,α-diethoxyacetophenone, 2-hydroxy-2- methyl-1-phenyl-1-propanone (HMPP), 2-methyl-2-morpholine-1-(4-methylphenylthio)propan-1-one, or combinations thereof; the benzoin includes benzoyl, acetophenone, benzoin ether, or combinations thereof; and the diimidazole includes hexaaryl diimidazole.

In an embodiment of the present invention, the photoresist solvent is selected from at least one of an ester solvent, an ether solvent, and a ketone solvent. Preferably, the ester solvent includes: ethylene glycol ethyl ether acetate, diethylene glycol butyl ether acetate, propylene glycol monomethyl ether ester, or combinations thereof; the ether solvent includes diethylene glycol diethyl ether, ethylene glycol dibutyl ether, or combinations thereof; and the ketone solvent includes cyclohexanone, isophorone, or combinations thereof.

In an embodiment of the present invention, the additive is selected from at least one of a silane coupling agent, an antioxidant, an ultraviolet absorber, an antifoaming agent, and a leveling agent.

According to the above embodiment, the present invention provides a color photoresist composition in which a semi-sandwich type phthalocyanine compound is introduced as a dye, which can effectively alleviate light scattering caused by pigment particles in a photoresist due to its high thermal stability and high solubility, thereby improving transmittance and contrast of a color filter.

While the invention has been described by way of example and in terms of the preferred embodiments, it is to be understood that the invention is not limited to the disclosed embodiments. To the contrary, it is intended to cover various modifications and similar arrangements. Therefore, the scope of the appended claims should be accorded the broadest interpretation so as to encompass all such modifications and similar arrangements.

What is claimed is:

1. A color photoresist composition, based on 100 parts by weight of the color photoresist composition, comprising:
   5-8 parts by weight of a pigment;
   5-8 parts by weight of an alkali soluble resin;
   5-8 parts by weight of a phthalocyanine semi-sandwich dye;
   0.2-0.6 parts by weight of a photoinitiator;
   70-85 parts by weight of a photoresist solvent; and
   0.1-0.2 parts by weight of an additive, wherein
   the phthalocyanine semi-sandwich dye comprises a semi-sandwich type phthalocyanine compound and a dye solvent, and the semi-sandwich type phthalocyanine compound has a structure of Formula 1:

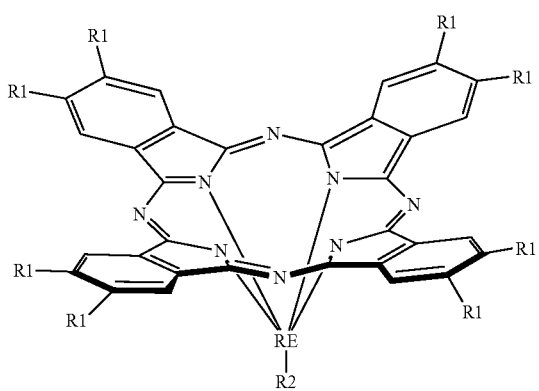

Formula 1 in the Formula 1, a central coordination metal RE is a rare earth metal element;

R1 is selected from at least one of a benzene ring, a naphthalene ring, —COOH, —COOCH$_3$, —NH$_2$, —N(CH$_3$)$_2$, —SH, or —SCH$_3$; and R2 is an organic compound containing an O or N coordinating atom, and the alkali-soluble resin is selected from at least one of an alkyl-substituted acrylic resin, an unsaturated group-substituted acrylic resin, and an epoxy group-substituted acrylic resin.

2. The color photoresist composition according to claim 1, wherein the rare earth metal element comprises: lanthanum (La), cerium (Ce), praseodymium (Pr), cerium (Nd), cerium (Pm), cerium (Sm), europium (Eu), gadolinium (Gd), terbium (Tb), dysprosium (Dy), holmium (Ho), erbium (Er), thulium (Tm), ytterbium (Yb), lutetium (Lu), yttrium (Y), or scandium (Sc).

3. The color photoresist composition according to claim 1, wherein
   R2 is selected from at least one of acetic acid and acetylacetone.

4. The color photoresist composition according to claim 1, wherein the dye solvent is selected from at least one of chloroform (CHCl$_3$), methyl acetate (CH$_3$COOCH$_3$), and dimethyl sulfoxide (DMSO).

5. The color photoresist composition according to claim 1, wherein the pigment comprises at least one of a green pigment, a blue pigment, and a yellow pigment, wherein
   the green pigment comprises a halogen-substituted copper phthalocyanine pigment;
   the blue pigment comprises a copper phthalocyanine pigment; and
   the yellow pigment comprises an indoline-based pigment, a quinophthalone-based pigment, a nickel composite pigment, or combinations thereof.

6. The color photoresist composition according to claim 1, wherein
   the alkyl-substituted acrylic resin comprises: acrylic acid, alkyl methacrylate, aryl methacrylate, methacrylate alcohol ester, or combinations thereof;
   the unsaturated group-substituted acrylic resin comprises succinic acid methacrylate; and
   the epoxy group-substituted acrylic resin comprises epoxy acrylate, epoxy methacrylate, epoxy alkyl methacrylate, epoxy aryl methacrylate, or combinations thereof.

7. The color photoresist composition according to claim 1, wherein the photoinitiator is selected from at least one of acetophenone, benzoin, diimidazole, and benzophenone, wherein
   the acetophenone comprises α,α-diethoxyacetophenone, 2-hydroxy-2-methyl-1-phenyl-1-propanone (HMPP), 2-methyl-2-morpholine-1-(4-methylphenylthio)propan-1-one, or combinations thereof;
   the benzoin comprises benzoyl, acetophenone, benzoin ether, or combinations thereof; and
   the diimidazole comprises hexaaryl diimidazole.

8. The color photoresist composition according to claim 1, wherein the photoresist solvent is selected from at least one of an ester solvent, an ether solvent, and a ketone solvent, wherein
   the ester solvent comprises: ethylene glycol ethyl ether acetate, diethylene glycol butyl ether acetate, propylene glycol monomethyl ether ester, or combinations thereof;

the ether solvent comprises diethylene glycol diethyl ether, ethylene glycol dibutyl ether, or combinations thereof; and the ketone solvent comprises cyclohexanone, isophorone, or combinations thereof.

9. The color photoresist composition according to claim 1, wherein the additive is selected from at least one of a silane coupling agent, an antioxidant, an ultraviolet absorber, an antifoaming agent, and a leveling agent.

\* \* \* \* \*